Aug. 7, 1962 T. B. WARREN ET AL 3,048,783

SIGNAL RECEIVING SYSTEM

Filed April 28, 1959 2 Sheets-Sheet 1

INVENTORS.
THOMAS B. WARREN
JACK B. HARVEY
BY Alfred C. Hill
AGENT

Aug. 7, 1962 T. B. WARREN ET AL 3,048,783

SIGNAL RECEIVING SYSTEM

Filed April 28, 1959 2 Sheets-Sheet 2

INVENTORS.
THOMAS B. WARREN
JACK B. HARVEY
BY Alfred C. Hill
AGENT

United States Patent Office 3,048,783
Patented Aug. 7, 1962

3,048,783
SIGNAL RECEIVING SYSTEM

Thomas B. Warren, New York, N.Y., and Jack B. Harvey, Clifton, N.J., assignors to International Telephone and Telegraph Corporation, Nutley, N.J., a corporation of Maryland Filed Apr. 28, 1959, Ser. No. 809,483
9 Claims. (Cl. 325—445)

The present invention relates to signal receiving systems and more particularly to signal receiving systems employing parametric converters.

The sensitivity of a VHF or UHF receiver system is largely determined by the noise generated within the receiver itself. The noise generated within a receiver is measured in terms of its noise figure which may be minimized by employing a low-noise amplifier or converter of sufficient gain at the receiver input.

A parametric amplifier is a device often used as a low noise element. The parametric amplifier usually consists of a reactance circuit including a first tuned circuit, designated as the signal frequency circuit, tuned to a frequency $f_1$, a second tuned circuit, designated as the idling circuit, tuned to a frequency $f_2$ and a variable reactance coupling circuit connected in common to the two tuned circuits; and a pump oscillator generating a signal having a frequency of $f_p$, said pump oscillator varying the coupling reactance of said variable reactance coupling circuit at a frequency of $f_p$. The variable reactance circuit preferably is a semiconductor diode whose capacitance is varied at the frequency rate $f_p$. The idling circuit is usually tuned so that $f_2$ is equal to $f_p-f_1$. It is also possible, though not usual, to tune the idling circuit so that $f_2$ is equal to $f_p+f_1$. Conventional parametric amplifiers have their output circuits coupled to the signal frequency circuit $f_1$. The parametric amplifier may also be used as a parametric converter by coupling the output circuit to the idling frequency circuit $f_2$. As a parametric converter, an additional gain factor $f_2/f_1$ is obtained. Therefore, it is desirable to use the parametric device as a converter because, $f_2$ being greater than $f_1$, a higher gain is obtained with less regeneration, resulting in a more stable system.

However, one of the effects of a parametric converter is to provide an output signal having a frequency greater than the frequency of the incoming signal. This frequency increase comes about since $f_2$, the frequency of the output signal, is tuned so that it is equal to $f_p-f_1$ and $f_1$ is normally less than half the value of $f_p$. This frequency increase is contrary to the requirements of the VHF and UHF with which the parametric converter is to be used, therefore some provision must be made to convert the frequency back down to a workable value without increasing the noise level thereby. Another requirement of parametric converters is that the pump oscillator, an integral part of the converter, be highly frequency stable since fluctuations in frequency $f_p$ will effect the stability of the frequency of the output signal therefrom. This stability requirement necessitates complicated oscillator design and hence increased cost and substantially eliminates the utilization of conventional, commercially available reflect klystron as the pump oscillator.

Signal receiving systems particularly in the microwave region, require frequency stabilized local oscillator signals of relatively high power, to accomplish the desired heterodyning of the received signals. It is known that stabilization of a high-power oscillator is more difficult than stabilization of a low power oscillator. Therefore, it would be desirable to provide a frequency stabilized signal from a low-power oscillator for easy frequency stability and then increase the frequency of said stabilized signal and increase the power thereof for desired heterodyning operation.

An object of the present invention is to provide an improved signal receiving system.

Another object of the present invention is to provide an improved signal receiving system having a reduced noise level.

Still another object of the present invention is to provide a signal receiving system employing a parametric converter system and having a source of local oscillator signal of sufficient force for heterodyning purposes, said source being relatively of simple design.

A further object of the present invention is to provide a signal receiving system having a local oscillator signal of sufficient power for heterodyning purposes, said oscillator signal being derived from a relatively low-power frequency stabilized source.

Another object of the present invention is to provide an improved signal receiving system employing a parametric-converter where the frequency of the output signal of the signal receiving system is independent of fluctuations in pump oscillator frequency.

Still another object of the present invention is to provide a signal receiving system employing a parametric-converter where the output signal of the receiving system is no greater than the signal input to said receiver system.

A feature of the present invention is a low noise amplifier incorporated in a signal receiving system employing a parametric converter including a reactance circuit and a pump oscillator wherein the signal outputs of the reactance circuit and pump oscillator are combined by a common means to provide an output signal having a predetermined frequency independent of the pump oscillator frequency and having a reduced noise level relative to the noise level of the equivalent signal in comparable prior art receiving systems.

Another feature of the present invention is a low noise amplifier incorporated in a signal receiving system of the type described above wherein the common combining means includes a heterodyning means, such as a mixer, and a filter.

Still another feature of the present invention is a low-noise amplifier incorporated in a signal receiving system of the type described above wherein the common combining means includes a stabilized oscillator, a second reactance circuit, and a heterodyning means, such as a mixer.

A further feature of the present invention is a low-noise amplifier incorporated in a signal receiving system of the type described above wherein the common combining means includes a stabilized oscillator, and a first and second heterodyning means, such as two mixers.

The foregoing and other objects and features of this invention and the manner of attaining them will become more apparent and the invention itself will be best understood by reference to the following description of an embodiment of the invention taken in conjunction with the accompanying drawings comprising FIGS. 1, 2 and 3, wherein.

Figure 1:
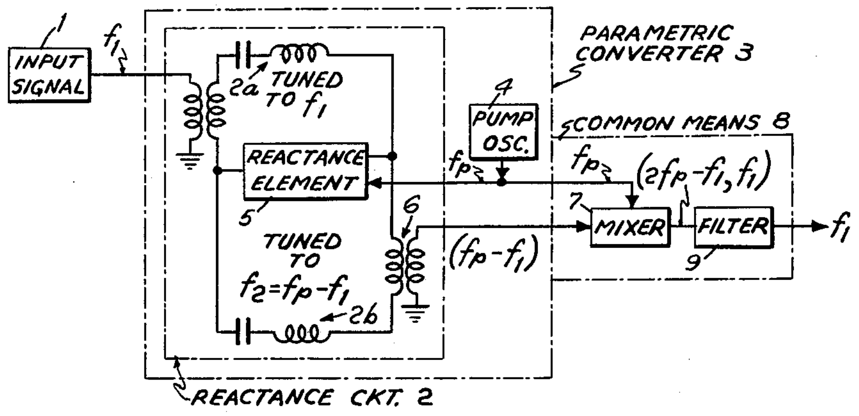
FIG. 1 is a schematic diagram of one embodiment of a low-noise amplifier following the principles of this invention.

Referring to FIG. 1, an input signal source 1, at frequency $f_1$, is coupled to the input portion 2$a$ of reactance circuit 2 of parametric converter 3. Pump oscillator 4 is coupled to reactance element 5 to vary the reactance thereof at frequency rate $f_p$ which causes an energy transfer to the reactance circuit. In accordange with our circuit arrangement hereinafter described, pump oscillator 4 may be a commercially available reflex klystron generator having a relatively unstable frequency output. Reactance element 5 may be a variable-capacitance semiconductor diode. The output from parametric converter 3 is taken from idling circuit 2b of reactance circuit 2. Circuit 2b is tuned to the lower sideband $f_2$ equal to $f_p - f_1$. An improvement in the noise figure is thereby accomplished by converter 3. However, since $f_1$ is usually less than half the value of $f_p$, an undesired increase in frequency has been realized at output 6. In accordance with our improved low-noise amplifier arrangement, the signal at output 6 is applied to a heterodyning means, such as mixer 7, forming a portion of common means 8. The signal output of pump oscillator 4 is also coupled to mixer 7 so that the signal at output 6 having a frequency equal to $f_p - f_1$ is heterodyned by the signal at frequency $f_p$. The output of mixer 7 consists of frequencies $2f_p - f_1$ and $f_1$. Filter 9, also included as a portion of common means 8, is coupled to the output of mixer 7 to attenuate the signal at $2f_p - f_1$ and pass only the signal at $f_1$. Thus, there is provided an output signal having a frequency equal to the frequency of the original input signal independent of fluctuation in pump oscillator frequency since any fluctuation in the frequency $f_p$ will be canceled or removed by mixer 7 and filter 9. While circuit 2b was described as being tuned to the lower sideband $f_2$ equal to $f_p - f_1$, it is to be understood that circuit 2b may also be tuned to upper sideband $f_2$ equal to $f_p + f_1$ with the same ultimate output frequency, but with a less improved noise level.

Therefore, by means of the present invention, a parametric converter has been incorporated in a circuit arrangement to provide amplification and noise reduction, and to bring about elimination of pump frequency variation in the output signal of the circuit arrangement that has a frequency no greater than the frequency of the original input signal. The circuit arrangement thereby avoids the necessity of employing noise inducing filters to reduce the frequency of the signal output of the parametric converter and the necessity for employing a pump oscillator having a highly stable frequency output signal.

Figure 2:
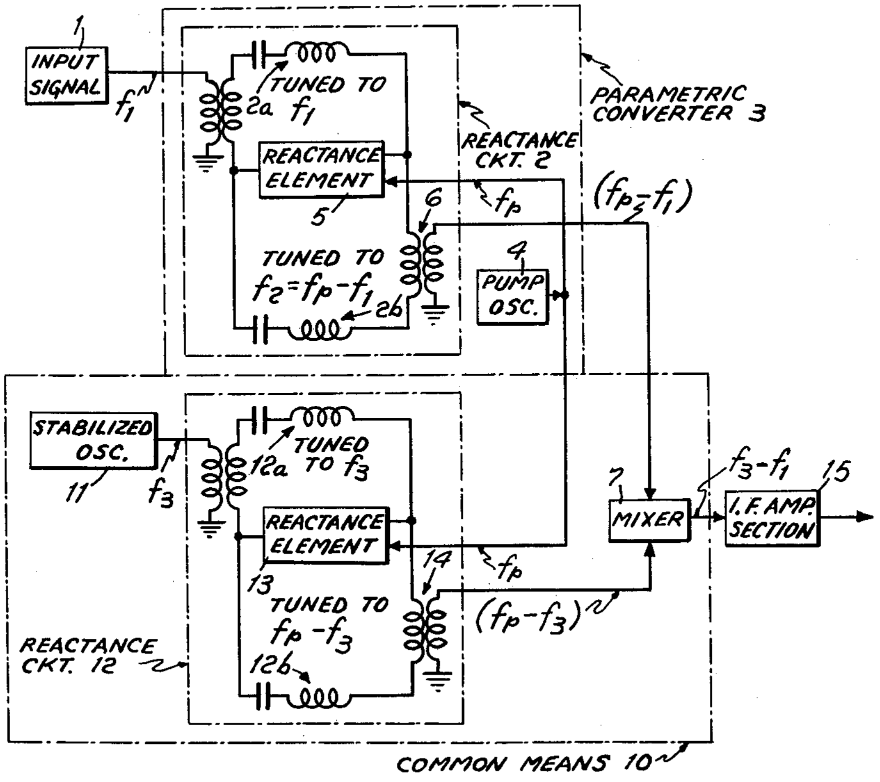
FIG. 2 is a schematic diagram of another embodiment of a low-noise amplifier following the principles of this invention.

Referring to FIG. 2, a second embodiment of the present invention is shown, wherein it is possible to obtain an output signal having a frequency dependent in part on the frequency of a stabilized, low-power oscillator and lower than the frequency of the input signal. Input signal source 1 and parametric converter 3 are identical to those described hereinabove, but common means 10 differs from common means 8 of FIG. 1 in that common means 10 includes a stabilized oscillator 11 and a second reactance circuit 12 in addition to mixer 7. Input signal source 1 and parametric converter 3 cooperate in a fashion similar to that described with reference to FIG. 1 to produce a signal having a frequency at output 6 equal to $f_p - f_1$, said output frequency being coupled to mixer 7 of common means 10. The output of pump oscillator 4 is coupled to reactance circuit 12 as well as to reactance circuit 2 to vary reactance element 13 at pump frequency $f_p$. Reactance circuit 12, by sharing pump oscillator 4 forms, in effect, a second parametric converter. Low-power frequency stabilized oscillator 11, such as a crystal controlled oscillator, generates a signal having a frequency $f_3$ which is coupled to reactance circuit 12 at tuned circuit 12a. Through the action of element 13 whose reactance is varied at a rate of $f_p$, an output signal is produced in tuned circuit 12b and at output 14 having a frequency equal to $f_p - f_3$ with an accompanying increase in the power level of the signal oscillator 11. The output signal from 14 is applied to mixer 7 where it is heterodyned with the output signal from 6. The output from mixer 7 contains the frequencies $2f_p - (f_1 + f_3)$ and $f_3 - f_1$. If $f_3$ is correctly preselected, the signal having a frequency equal to $f_3 - f_1$ may be the desired input to the IF section 15 of a receiving system. It is to be understood that idling circuit 2b may be tuned to the upper sideband $f_2$ equal to $f_p + f_1$ with the same results provided that circuit 12b is also tuned to upper sideband $f_p + f_3$. This is not a usual arrangement since the noise level is not improved as much as it might be if the lower sideband were used.

The advantages of the embodiment shown in FIG. 2 are that the frequency of the output signal is independent of the pump frequency, permitting a commercially available reflex klystron to be employed, therefore the employment of a second parametric converter sharing a pump oscillator with a first parametric converter permits the use of a low-power frequency stabilized oscillator from which a heterodyning signal of suitable power may be derived to provide an intermediate frequency signal when heterodyned with the output of the first parametric converter, thereby eliminating the frequency stability problem of a high power oscillator and finally the noise level of the receiving system is improved as originally desired.

In the operation of a system as illustrated in FIG. 2, the following is a table of typical frequencies, power levels and gain for various signals and components therein.

| Signal or Component | Frequency, mc. | Power Level or Gain |
|---|---|---|
| $f_1$ | 1,000 | −80 dbm (power). |
| converter 3 | | 20 db (gain). |
| $f_p$ | 6,000 | +27 dbm (power). |
| $f_p - f_1$ | 5,000 | −60 dbm (power). |
| $f_3$ | 930 | −20 dbm (power). |
| Reactance circuit 12 and oscillator 4 | | 30 db (gain). |
| $f_p - f_3$ | 5,070 | +10 dbm (power). |
| $f_3 - f_1$ | 70 | −68 dbm (power). |

Figure 3:
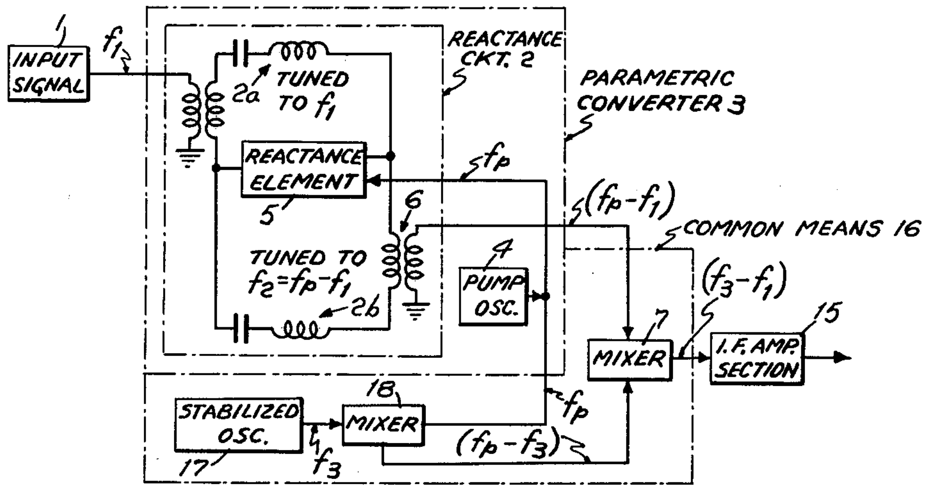
FIG. 3 is a schematic diagram of still another embodiment of a low-noise amplifier following the principles of this invention.

While it is preferable from the viewpoint of low power and frequency stability to employ the embodiment shown in FIG. 2, when a high power oscillator is available and/or cost is not prohibitive, the circuitry illustrated in FIG. 2 may be simplified as shown in FIG. 3.

Referring to FIG. 3, input signal source 1 and parametric converter 3 cooperate as described in connection with FIG. 2. Common means 16, however, employs a stabilized oscillator 17 having a higher power output than oscillator 11 of FIG. 2. The output signal of oscillator 17 at frequency $f_3$ is fed to a conventional mixer 18 where it is mixed with a signal at frequency $f_p$ obtained from pump oscillator 4 producing an output signal having a frequency equal to $f_p - f_3$. The output signal from mixer 18 is applied to mixer 7 where it is heterodyned with the output signal from 6. The output signal from mixer 7 contains the frequencies $2f_p - (f_1 + f_3)$ and $f_3 - f_1$. Since $f_3$ may be preselected, the signal having a frequency equal to $f_3 - f_1$ may be the desired input to the IF section 15 of a receiving system.

While this embodiment has the advantage of being less complex than FIG. 2, a higher power oscillator is required. Therefore this embodiment may be employed where a high power oscillator is available and/or cost is not prohibitive to provide an output signal independent of the pump frequency, permitting a commercially available reflex klystron to be employed, and the desired noise level improvement.

While we have described above the principles of our invention in connection with specific apparatus, it is to be clearly understood that this description is made only by way of example and not as a limitation to the scope of our invention as set forth in the objects thereof and in the accompanying claims.

We claim:

1. In a signal receiving system, a low noise amplifier comprising a parametric converter including a first reactance circuit and a pump oscillator, a first source of signals having a predetermined frequency coupled to said first reactance circuit, a second reactance circuit coupled to the output of said pump oscillator, a second source of signals having a selected frequency coupled to the input of said second reactance circuit, and a heterodyning means coupled to the output of said first reactance circuit and the output of said second reactance circuit to provide an output signal having a given frequency and a low noise level.

2. In a signal receiving system, a low noise amplifier comprising a parametric converter including a first reactance circuit and a pump oscillator, a source of signals having a predetermined frequency coupled to said first reactance circuit, a second reactance circuit coupled to the output of said pump oscillator, a stabilized oscillator means coupled to the input of said second reactance circuit and a mixer coupled to the output of said first reactance circuit and the output of said second reactance circuit to provide an output signal having a frequency lower than said predetermined frequency and a low noise level.

3. In a signal receiving system, a low noise amplifier comprising a parametric converter including a reactance element, first and second circuits tuned respectively to first and second frequencies, means coupling said reactance element in parallel with said first and second tuned circuits, a source of signal at said first frequency coupled to said first tuned circuit, a pump oscillator directly coupled to said reactance element, and common means directly coupled to the output of said pump oscillator and directly coupled to said second tuned circuit to provide an output signal having a given frequency and a low noise level.

4. A low noise amplifier according to claim 3 wherein said given frequency of said output signal is equal to said first frequency.

5. A low noise amplifier according to claim 3 wherein said given frequency of said output signal is lower than said first frequency.

6. In a signal receiving system, a low noise amplifier comprising a parametric converter including a reactance element, first and second circuits tuned respectively to first and second frequencies, means coupling said reactance element in parallel with said first and second tuned circuits, a source of signal at said first frequency coupled to said first tuned circuit, a pump oscillator directly coupled to said reactance element, heterodyning means directly coupled to said second tuned circuit and directly coupled to the output of said pump oscillator, and frequency selecting means coupled to the output of said heterodyning means to provide an output signal having a given frequency equal to said first frequency and a low noise level.

7. In a signal receiving system, a low noise amplifier comprising a parametric converter including a reactance element, first and second circuits tuned respectively to first and second frequencies, means coupling said reactance element in parallel with said first and second tuned circuits, a source of signal at said first frequency coupled to said fist tuned circuit, a pump oscillator directly coupled to said reactance element, a mixer directly coupled to said second tuned circuit and directly coupled to the output of said pump oscillator, and a filter coupled to the output of said mixer to provide an output signal having a frequency equal to said first frequency and a low noise level.

8. In a signal receiving system, a low noise amplifier comprising a parametric converter including a reactance element, first and second circuits tuned respectively to first and second frequencies, means coupling said reactance element in parallel with said first and second tuned circuits, a source of signal at said first frequency coupled to said first tuned circuit, a pump oscillator directly coupled to said reactance element, a source of signal at a third frequency, a first heterodyning means directly coupled to the output of said pump oscillator and directly coupled to the output of said source of signal at a third frequency, and a second heterodyning means directly coupled to the output of said first heterodyning means and directly coupled to said second tuned circuit to provide an output signal having a given frequency and a low noise level.

9. In a signal receiving system, a low noise amplifier comprising a parametric converter including a reactance element, first and second circuits tuned respectively to first and second frequencies, means coupling said reactance element in parallel with said first and second tuned circuits, a pump oscillator directly coupled to said reactance element, a source of signal at said first frequency coupled to said first tuned circuit, a stabilized oscillator at a third frequency, a first mixer directly coupled to the output of said pump oscillator and directly coupled to the output of said stabilized oscillator, and a second mixer directly coupled to the output of said first mixer and directly coupled to said second tuned circuit to provide an output signal having a frequency lower than said first frequency and a low noise level.

References Cited in the file of this patent

UNITED STATES PATENTS

| | | |
|---|---|---|
| 2,509,963 | Collins | May 30, 1950 |
| 2,719,223 | Van der Ziel | Sept. 27, 1955 |

OTHER REFERENCES

Chang et al.: "A Parameteric Amplifier Using Lower-Frequency Pumping," Proceedings of the IRE, July 1958, vol. 46, No. 7, pages 1383 to 1386.

Nergaard: "Nonlinear-Capacitance Amplifiers," RCA Review, March 30, 1959, pages 3 to 17.